US008119498B2

(12) United States Patent
Mengi et al.

(10) Patent No.: US 8,119,498 B2
(45) Date of Patent: Feb. 21, 2012

(54) WAFER BONDING METHOD AND WAFER STACK FORMED THEREBY

(75) Inventors: Guangqing Mengi, Ann Arbor, MI (US); Yafan Zhang, Troy, MI (US); Navid Yazdi, Ann Arbor, MI (US)

(73) Assignee: Evigia Systems, Inc., Ann Arbor, MI (US)

( * ) Notice: Subject to any disclaimer, the term of this patent is extended or adjusted under 35 U.S.C. 154(b) by 107 days.

(21) Appl. No.: 12/565,298

(22) Filed: Sep. 23, 2009

(65) Prior Publication Data

US 2010/0072555 A1    Mar. 25, 2010

Related U.S. Application Data

(60) Provisional application No. 61/194,090, filed on Sep. 24, 2008.

(51) Int. Cl.
*H01L 21/46* (2006.01)
(52) U.S. Cl. ........................................... 438/456
(58) Field of Classification Search .................. 438/455, 438/438, 118, 406, 456, 502
See application file for complete search history.

(56) References Cited

U.S. PATENT DOCUMENTS

| 4,103,273 A | 7/1978 | Keller |
| 4,701,424 A | 10/1987 | Mikkor |
| 5,760,473 A | 6/1998 | Dickson et al. |
| 6,232,150 B1 | 5/2001 | Lin et al. |
| 6,528,344 B2 * | 3/2003 | Kang ............................ 438/106 |
| 7,104,129 B2 | 9/2006 | Nasiri et al. |

OTHER PUBLICATIONS

Fundamentals of Pulse Heated Reflow Soldering by Miyachi Unitek at http://www.miyachiunitek.com/EducationalResources_Fundamentals).*

* cited by examiner

*Primary Examiner* — Thomas L Dickey
*Assistant Examiner* — Nikolay Yushin
(74) *Attorney, Agent, or Firm* — Hartman & Hartman, P.C.; Gary M. Hartman; Domenica N. S. Hartman (57) ABSTRACT

A wafer bonding process that compensates for curvatures in wafer surfaces, and a wafer stack produced by the bonding process. The process entails forming a groove in a surface of a first wafer, depositing a bonding stack on a surface of a second wafer, aligning and mating the first and second wafers so that the bonding stack on the second wafer contacts a bonding site on the first wafer, and then heating the first and second wafers to reflow the bonding stack. The groove either surrounds the bonding site or lies entirely within the bonding site, and the heating step forms a molten bonding material, causes at least a portion of the molten bonding material to flow into the groove, and forms a bonding structure that bonds the second wafer to the first wafer. Bonding stacks having different lateral surface areas can be deposited to form bonding structures of different heights to compensate for variations in the wafer gap.

24 Claims, 6 Drawing Sheets

WAFER BONDING METHOD AND WAFER STACK FORMED THEREBY

CROSS REFERENCE TO RELATED APPLICATIONS

This application claims the benefit of U.S. Provisional Application No. 61/194,090, filed Sep. 24, 2008, the contents of which are incorporated herein by reference.

STATEMENT REGARDING FEDERALLY SPONSORED RESEARCH

This invention was made with government support under Contract No. FA8650-07-C-1184 awarded by US Air Force. The Government has certain rights in the invention.

BACKGROUND OF THE INVENTION

The present invention generally relates to the fabrication and bonding of wafers, such as wafers for integrated circuit (IC) devices. More particularly, this invention relates to processes and bonding pad structures capable of compensating for nonplanarities in wafer surfaces.

The fabrication of MEMS (microelectromechanical systems) devices typically entails bulk micromachining, surface machining, or combinations of the two to produce a three-dimensional (3-D) sensing structure. A MEMS device is often integrated with one or more CMOS readout circuits by means of wafer-level bonding, in which the wafer on which MEMS devices have been fabricated (the "MEMS wafer") is bonded to the wafer on which CMOS circuits have been fabricated (the "CMOS wafer"). Because of the thermal budget for CMOS circuits, low temperature metal bonding methods, including solder bonding, transient liquid phase (TLP) bonding, and eutectic bonding, are commonly used when bonding MEMS and CMOS wafers. Metal bond stacks may be formed on either or both of the MEMS and CMOS wafers, followed by heating to melt (reflow) the bond stacks and then cooling to form the metallurgical bond. In the case of eutectic bonding, bond stacks may be formed to contain the desired eutectic alloy or different metal layers that when molten will form the desired eutectic alloy. Eutectic bonding can also be achieved by interdiffusion with the substrates being bonded. As a non-limiting example, if the substrates are silicon wafers, gold-silicon (Au—Si) eutectic bonding can be performed by depositing gold on one or both wafers, and then forming the desired Au—Si eutectic alloy (about 18.6 atomic percent Si; about 2.85 weight percent Si) by heating the wafers to cause interdiffusion of silicon from the wafers and gold from the deposited gold. The resulting Au—Si eutectic alloy melts as a result of having a lower melting temperature (about 363° C.) than either gold or silicon (about 1065° C. and about 1410° C., respectively). On cooling, the Au—Si eutectic alloy solidifies and metallurgically bonds the wafers. Au—Si eutectic bonding offers certain notable advantages, including the ability to be performed at a relatively low temperature (about 363° C.) and providing excellent sealing hermeticity, high bonding strength and good long-term stability. As a result, Au—Si eutectic bonding has found uses in various semiconductor fabrication processes, including MEMS-CMOS integration and vacuum packaging of MEMS devices.

Figures 1A, 1B:
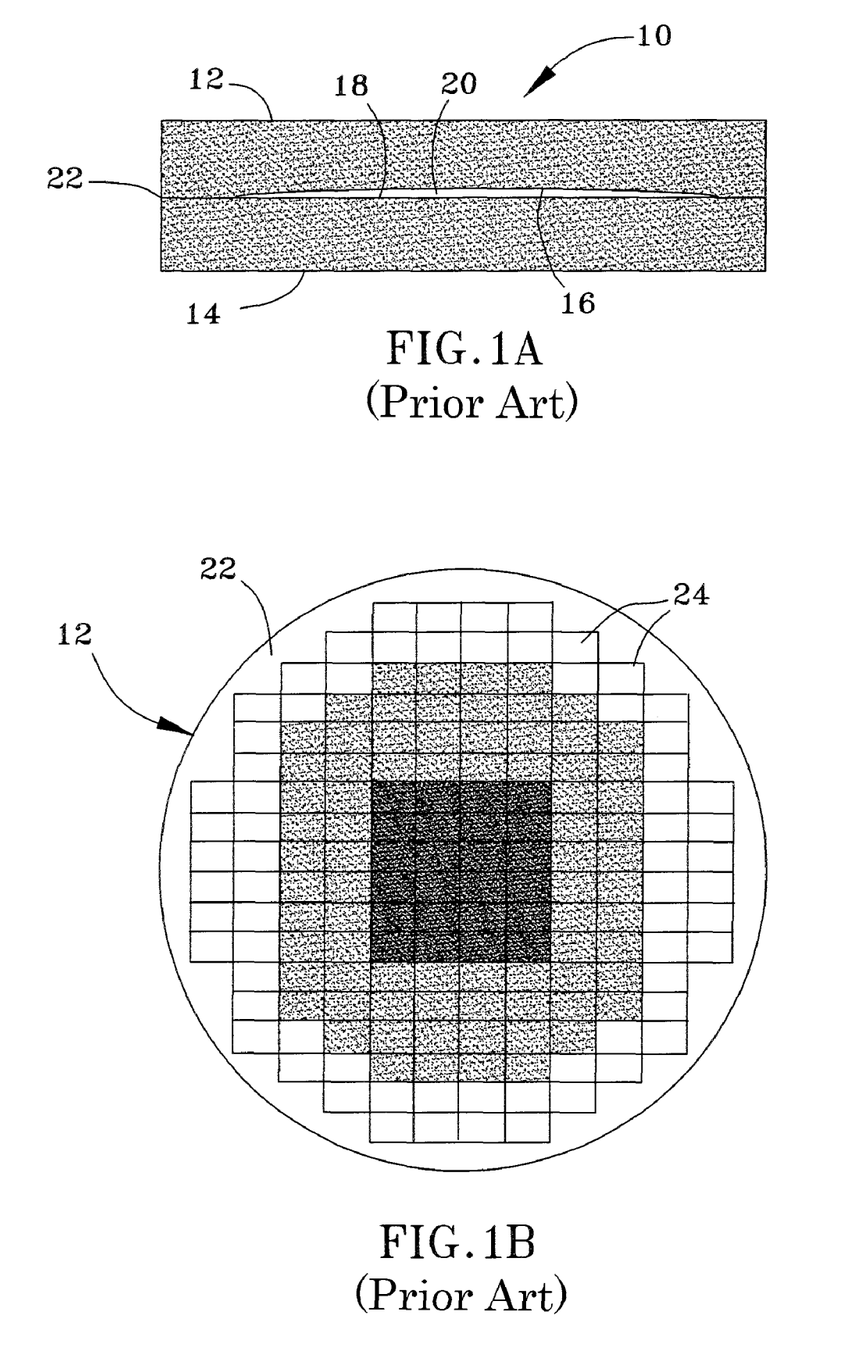
FIG. 1A schematically represents a cross-sectional view of a wafer stack containing a wafer that exhibits a significant degree of surface curvature.
FIG. 1B schematically maps the distribution of bonding forces that may be present at the interface of the wafers of FIG. 1A when increased bonding pressure is applied in an effort to overcome surface curvature.

Nonuniform metal bonding and reflow can occur if one or both wafers being bonded have a sufficient degree of curvature at their mating surfaces. The curvature of a wafer can be caused by various parameters and conditions. For example, curvature of silicon-on-insulator (SOI) wafers (widely used as device wafers for MEMS) can be induced when the MEMS structure is etched in the device layer of the wafer. While the amount of curvature tolerated by a metal bonding process will depend on various factors relating to processing conditions and packaging characteristics, it is believed that a radius of curvature of several hundred meters will typically not pose a problem during bonding, but that a radius of curvature of less than a hundred meters, for example, about sixty meters or less, may be sufficient to result in nonuniform metal bonding and reflow. As an example, in a Au—Si eutectic bonding process using a four micrometer-thick layer of plated gold, any wafer curvature resulting in a gap exceeding the thickness of the plated gold will likely result in incomplete or inadequate bonding. Though wafer curvature can be overcome to some degree by increased bonding pressure, excessive curvature will lead to reduced yields as a result of nonuniform bonding forces across the wafer interface. FIG. 1A schematically depicts a wafer stack 10 that is illustrative of this scenario. The upper wafer 12 is a device wafer whose surface 16 exhibits curvature (not to scale) as a result of processing (for example, multiple films), formation (for example, SOI), etc. As a result, a gap 20 is present within the interface 22 between the surface 16 of the device wafer 12 and the mating surface 18 of a CMOS wafer 14. FIG. 1B maps the distribution of bonding forces that may be present at bonding sites 24 between the wafers 10 and 12 if increased bonding pressure is applied in an effort to overcome wafer curvature. Light shading near the perimeter of the interface 22 denotes the presence of excessive bonding forces that can lead to metal squeeze-out and electrical shorting between electrodes, and dark shading at the center of the interface 22 denotes areas where the bonding forces do not sufficiently overcome the curvature with the result that incomplete or weak bonding will occur. The intermediate shading denotes levels of bonding forces that are more likely to result in acceptable bonds.

Because a certain degree of wafer curvature always exists due to the nature of wafer formation and/or processing, it would be desirable to minimize or eliminate the detrimental effect of wafer curvature leading to nonuniform metal bonding.

BRIEF DESCRIPTION OF THE INVENTION

The present invention provides a wafer bonding process capable of compensating for curvatures in wafer surfaces, and a wafer stack produced by the bonding process.

According to a first aspect of the invention, the process entails providing a first bonding site on a surface of a first wafer, depositing at least a first bonding stack on a surface of a second wafer, forming at least a first groove in the surface of the first wafer, aligning and mating the first and second wafers so that the first bonding stack on the second wafer contacts the first bonding site on the first wafer, and then heating the first and second wafers to reflow the first bonding stack on the second wafer. The first groove either surrounds the first bonding site or lies entirely within the first bonding site, and the heating step forms a molten bonding material, causes at least a portion of the molten bonding material to flow into the first groove in the surface of the first wafer, and forms a first bonding structure that bonds to the first bonding site of the first wafer and bonds the second wafer to the first wafer.

According to a second aspect of the invention, the wafer stack comprises first and second wafers, a first bonding site on a surface of the first wafer, a first groove in the surface of the first wafer, and a first bonding structure bonded to the first bonding site of the first wafer and bonding the second wafer to the first wafer. The first groove either surrounds the first bonding site or lies entirely within the first bonding site, and at least a portion of the first bonding structure is present in the first groove in the surface of the first wafer.

According to another aspect of the invention, bonding stacks can be deposited to have different lateral surface areas to form bonding structures having different heights (thicknesses) across the interface between surfaces of the first and second wafers that are capable of compensating for variations in wafer gap. Bonding stacks having larger areas can be deposited where the wafer gap is larger, providing additional metal to form taller (thicker) bonding structures that bridge the larger wafer gap.

In view of the above, a preferred aspect of this invention is to provide bonding sites for metal bonding, including solder bonding, transient liquid phase (TLP) bonding, and eutectic bonding, at wafer level to overcome bonding problems encountered as a result of wafer curvature. Surface features in the form of grooves are defined in and/or surrounding bonding sites to serve as reflow reservoirs and/or barriers during the bonding process to limit electrical shorting between neighboring electrodes. The ability of the reservoirs and barriers to accommodate and restrict the flow of reflowed bonding material is advantageous because it allows sufficient bonding material to be deposited on a wafer with a significant amount of curvature in order to ensure that sufficient bonding material will be present where interface gaps will be the largest between a pair of wafers, while reducing or preventing the excess bonding material at other locations from overflowing the bonding site and shorting electrodes or other conductive structures in the vicinity of the bonding site during reflow. More uniform bonding can be further promoted with the use of bonding stacks whose areas are tailored to form bonding structures having different heights corresponding to the amount of curvature present at the wafer interface. The result is much better bonding strength and higher process yields for MEMS fabrication, micro-packaging and device-circuit integration.

Other aspects and advantages of this invention will be better appreciated from the following detailed description.

DETAILED DESCRIPTION OF THE INVENTION

For convenience, consistent reference numbers are used throughout the drawings to identify functionally similar elements.

Figure 3:
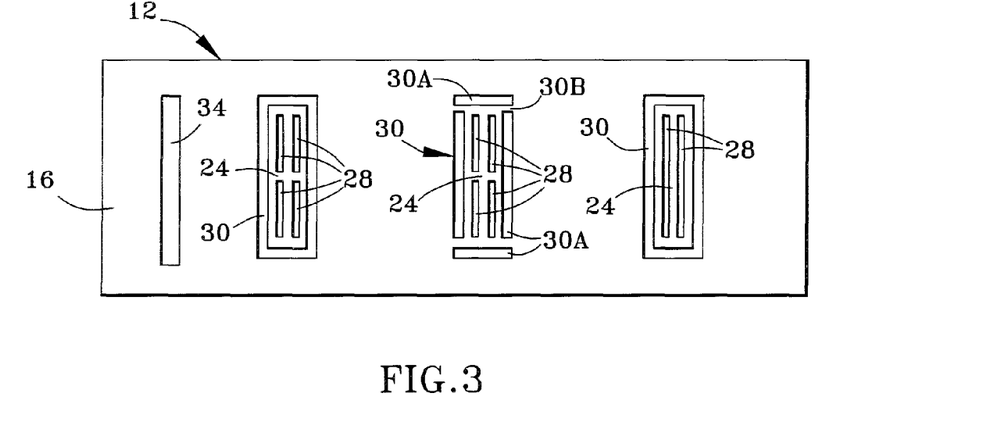
FIG. 3 is a schematic plan view of a device wafer showing multiple grooves that have been formed within bonding sites on the device wafer to define reflow reservoirs and barriers in accordance with an aspect of the invention.
Figure 4:
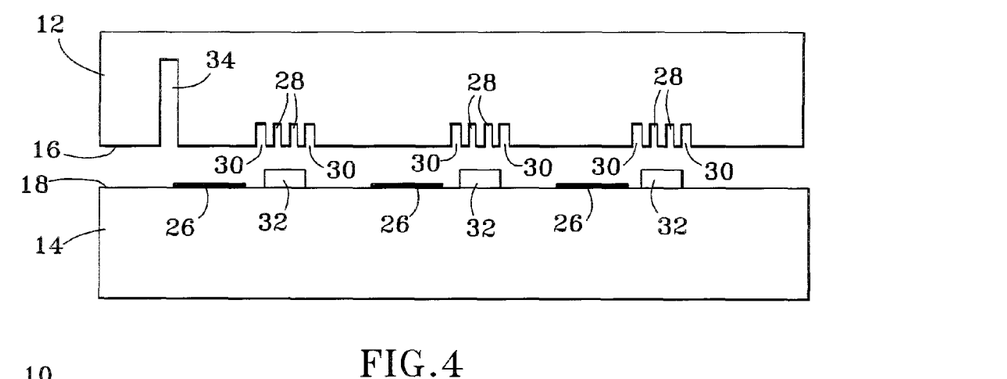
FIG. 4 schematically represents cross-sectional views of the device wafer of FIG. 3 aligned with a CMOS wafer for bonding using a metal bonding method.
Figure 5:
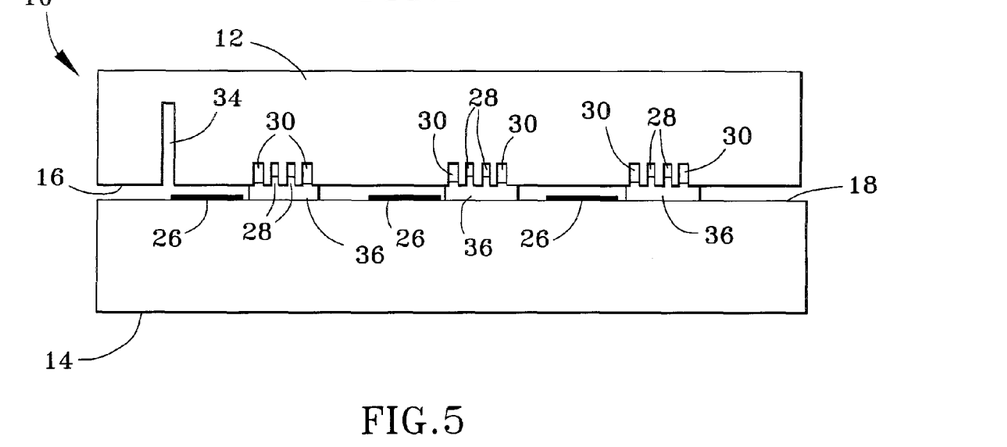
FIG. 5 schematically represents a cross-sectional view of the device and CMOS wafers of FIG. 4 following metal bonding.

FIGS. 3 through 11 represent embodiments of the invention by which electrical shorting of wafer bonding structures with neighboring conductive device and/or circuit elements can be minimized if not eliminated during a wafer bonding process. FIGS. 3 through 5 represent a first embodiment in which electrical shorting of bonding structures 36 with neighboring electrodes 26 on a CMOS wafer 14 can be minimized if not eliminated by the presence of reservoirs 28 and barriers 30 defined in a device (for example, MEMS) wafer 12 that is mated and bonded to the CMOS wafer 14 using a metal bonding method, such as (but not limited to) solder bonding, transient liquid phase (TLP) bonding, and eutectic bonding, to form a wafer stack 10 shown in FIG. 5. The invention will be described in particular reference to Au—Si eutectic bonding, though other metal bonding systems and methods are also within the scope of the invention.

If one or both wafers 12 and 14 are formed of silicon, the Au—Si eutectic alloy can be formed in situ by depositing (for example, by electroplating) bonding stacks 32 on the CMOS wafer 14 to contain only gold, and then diffusing silicon into the bonding stacks 32 from one or both wafers 12 and 14 during the eutectic bonding process. Alternatively, the Au—Si eutectic alloy can be formed in situ by depositing the bonding stacks 32 to contain layers of gold and silicon, or the Au—Si eutectic alloy may be directly deposited and patterned as bonding stacks 32 on the surface 18 of the CMOS wafer 14. During reflow bonding to form the bonding structures 36 shown in FIG. 5, the Au—Si eutectic alloy tends to flow from the bonding stacks 32 toward the electrodes 26, particularly from bonding stacks 32 subjected to greater bonding forces compared to other bonding stacks 32 between the wafers 12 and 14 as a result of one or both surfaces 16 and/or 18 of the wafers 12 and 14 having a sufficiently low radius of curvature, for example, less than a hundred meters and particularly about sixty meters or less. In the embodiment shown, excess molten reflow of the Au—Si eutectic alloy is drawn by capillary action into the reflow reservoirs 28 located within the bonding sites 24 on the surface 16 of the device wafer 12. The reflow barriers 30 surrounding the bonding sites 24 act to accommodate or otherwise trap any additional overflow that was not accommodated in the reservoirs 28, such that the reflowed gold and eutectic alloy are prevented from contacting the neighboring electrodes 26 on the CMOS wafer 14.

The shapes, widths and depths of the reservoirs 28 and barriers 30 can be configured according to application needs and process requirements. According to a preferred aspect of the invention, the integrity of the bonding sites 24 are maintained by forming the reservoirs 28 and barriers 30 to be narrower and shallower than etched features of the MEMS device, such as the etched trench 34 shown in FIGS. 3, 4 and 5. As an example, the reservoirs 28 and barriers 30 preferably have a width of up to about 40% of the minimum trench width of the MEMS structure on the device wafer 12, and a depth of up to about 50% of the minimum trench depth of the MEMS structure. As seen in the plan view of FIG. 3, the lefthand and center reflow reservoirs 28 are shown as four discrete grooves that are entirely within their respective bonding sites 24, whereas the righthand reflow reservoir 28 is shown as two discrete grooves entirely within the respective bonding site 24. As shown in FIG. 4, the wafers 12 and 14 are aligned so that each bonding stack 32 will be surrounded by its respective barrier(s) 30 and will bridge its respective reservoir(s) 28 after the wafers 12 and 14 are mated. Also in FIG. 3, the lefthand and righthand reflow barriers 30 are shown as continuous rings that completely surround their respective bonding sites 24, whereas the center reflow barrier 30 is shown as defining a discontinuous ring surrounding its bonding site 24 and made up of ring segments 30A separated by gaps 30B. The reservoirs and barriers 28 and 30 may be formed by any suitable method, such as wet or dry etching. Because they can be vertically etched into the substrate of the wafer 12, the reservoirs and barriers 28 and 30 do not consume any additional surface area on the wafer 12. Simultaneously, the grooves that form the reservoirs 28 and barriers 30 facilitate the bonding process by increasing the effective surface area of the bonding structure 36 at its interface with the device wafer surface 16.

FIGS. 6 through 12 depict additional embodiments of the invention that utilize reflow reservoirs 28 and/or barriers 30. Throughout the descriptions of the Figures, the term "reservoir" is used to denote grooves that directly contact a bonding stack 32 prior to the reflow process, such that their function is to draw excess reflow by capillary action from the bonding structure 36 formed by reflowing the bonding stack 32. In contrast, the term "barrier" is used to denote grooves that surround a bonding stack 32 and therefore do not directly contact the bonding stack 32 prior to the reflow process, such that their function is to accommodate any excess overflow of molten bonding material prior to solidification of the bonding structure 36 formed from the bonding stack 32.

Figure 6:
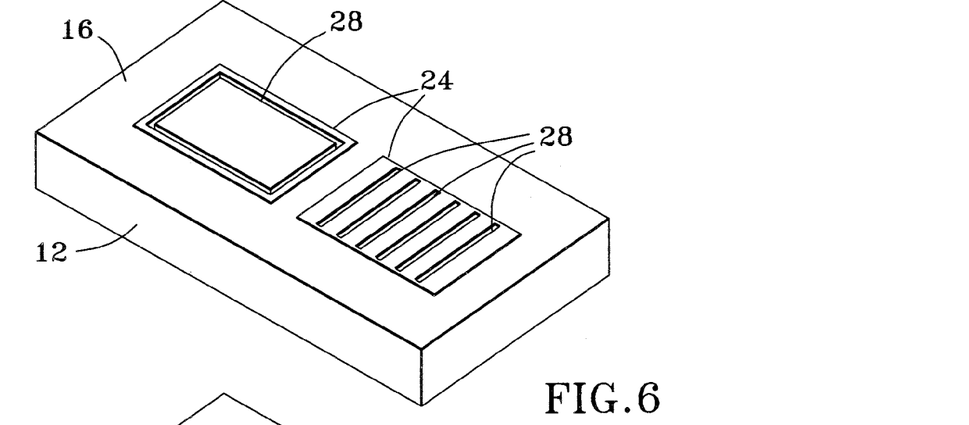
FIG. 6 schematically represents a wafer having a first bonding site containing a single groove that defines a ring-shaped reflow reservoir and a second bonding site containing an array of parallel grooves that define multiple reflow reservoirs in accordance with the invention.
Figure 7:
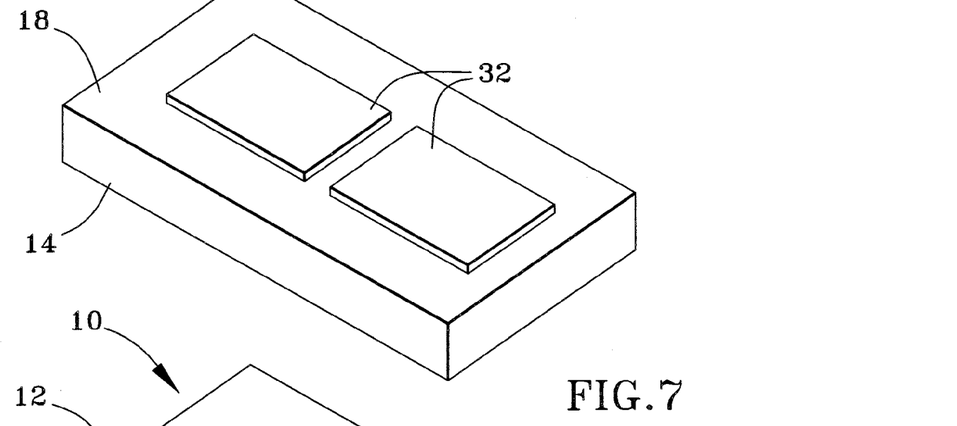
FIG. 7 schematically represents a wafer having bonding stacks located and sized for mating with the bonding sites of FIG. 6.
Figure 8:
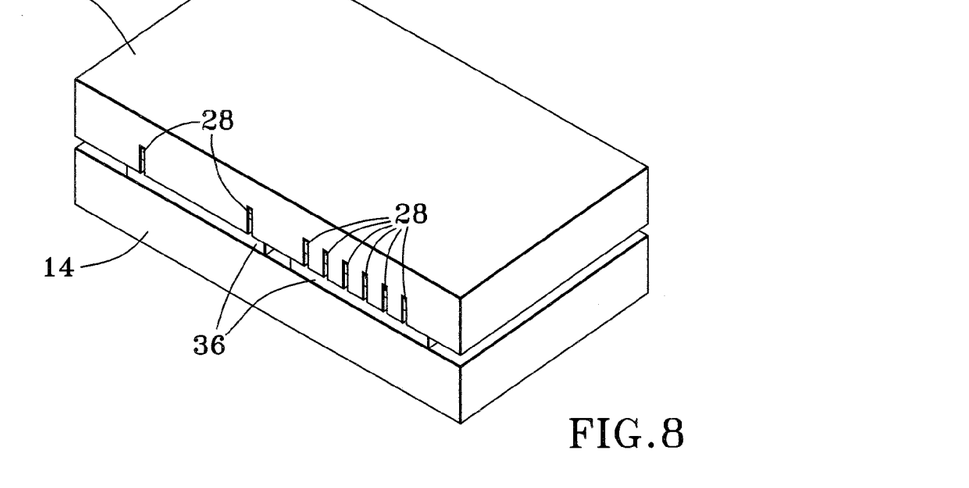
FIG. 8 schematically represents the wafers of FIGS. 6 and 7 following metal bonding.
Figure 9:
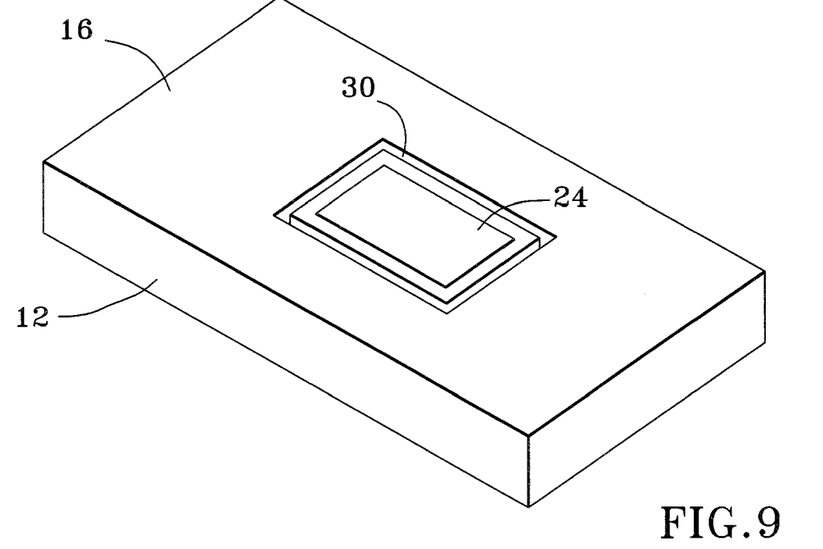
FIG. 9 schematically represents a wafer having a single groove that defines a ring-shaped reflow barrier surrounding a bonding site that will be mated with a bonding stack on another wafer (not shown) in accordance with the invention.
Figure 10:
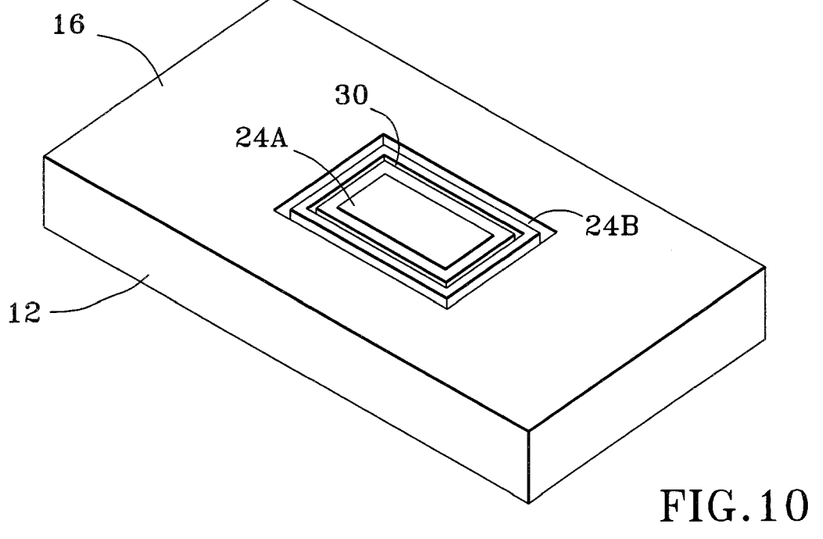
FIG. 10 schematically represents a wafer having a single groove that defines a ring-shaped reflow barrier that surrounds a first bonding site and is surrounded by a second bonding site, wherein each bonding site will be individually mated with a bonding stack on another wafer (not shown) in accordance with the invention.

Reflow reservoirs and barriers 28 and 30 of this invention can be configured for separate use on a substrate, for example, depending on the dimensions of the bonding sites 24 and specific designs. FIGS. 6 through 8 illustrate the use of only reservoirs 28 within bonding sites 24 on a wafer 12. The lefthand reservoir 28 of FIG. 6 is configured as a continuous ring that lies entirely within its bonding site 24, whereas the righthand side of the wafer 12 is provided with a reservoir 28 formed as an array of parallel grooves entirely within the bonding site 24. FIG. 7 represents the wafer 14 having a pair of gold bonding stacks 32, and with which the wafer 12 of FIG. 6 is mated and Au—Si eutectic bonded to form the bonding structures 36 and wafer stack 10 of FIG. 8. In contrast, FIGS. 9 and 10 illustrate the use of only reflow barriers 30 surrounding bonding sites 24 on wafers 12. The barrier 30 of FIG. 9 is configured as a continuous ring that entirely surrounds a bonding site 24, whereas the barrier 30 of FIG. 10 entirely surrounds one bonding site 24A, and in turn is entirely surrounded by a second ring-shaped bonding site 24B. Each of these wafers 12 can be mated and Au—Si eutectic bonded to another wafer (for example, a CMOS wafer 14) similar to those of FIGS. 4 and 7 to form bonding structures and wafer stacks similar to those of FIGS. 5 and 8.

Figure 11:
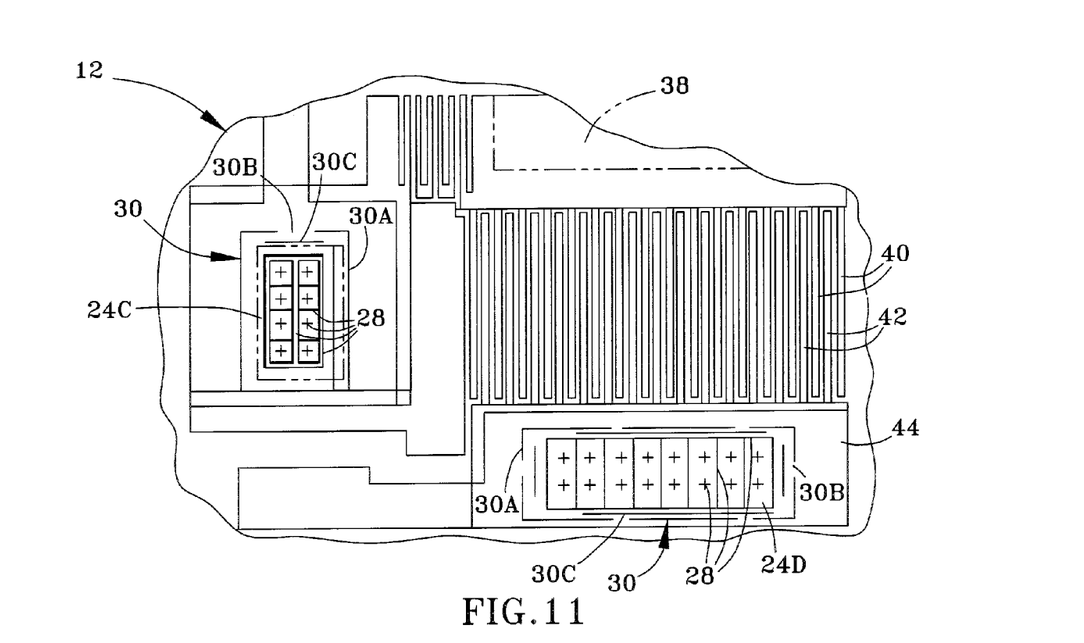
FIG. 11 schematically represents a portion of a layout for a MEMS accelerometer showing two bonding sites containing multiple reflow reservoirs and barriers for preventing electrical shorts between sensing fingers adjacent the bonding sites.
Figure 12:
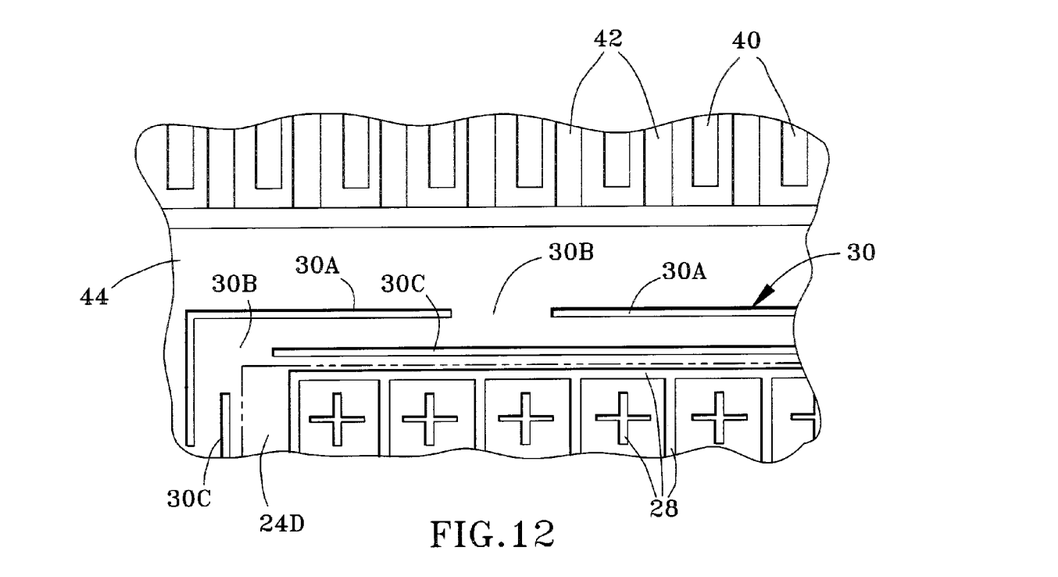
FIG. 12 is a detailed plan view of one of the bonding sites of FIG. 11.

FIGS. 11 and 12 represent an example of reflow reservoirs and barriers 28 and 30 in a MEMS application. FIG. 11 shows a portion of a layout for a MEMS accelerometer design that includes a proof mass 38 and interdigitated fingers 40 and 42 that extend from the proof mass 38 and an electrode 44, respectively. The fingers 40 and 42 define capacitive couples by which movement of the proof mass 38 is sensed. Inertial sensors with interdigitated fingers of the type shown in FIGS. 11 and 12 are well known in the art, a particularly advanced example of which is disclosed in commonly-assigned U.S. Pat. No. 7,562,573 to Yazdi, whose teachings regarding the fabrication and operation of a MEMS accelerometer are incorporated herein by reference. As indicated in FIG. 11, a bonding site 24C is located apart from the proof mass 38 and electrode 44, and a second bonding site 24D is formed on the electrode 44. Both bonding sites 24C and 24d are configured for mating with bonding stacks (not shown) on a second wafer (for example, a CMOS wafer), for example, electroplated gold bonding stacks for Au—Si eutectic bonding.

Because of the risk of shorting the fingers 40 and 42 with the reflowed bonding alloy during the reflow bonding process, each bonding site 24C and 24D is formed to contain multiple reflow reservoirs 28 and barriers 30. The reservoirs 28 comprise cross-shaped grooves within a grid formed by one or more arrays of parallel grooves. The barrier 30 surrounding the bonding site 24C includes a discontinuous ring 30 made up of a single outer ring segment 30A that forms a gap 30B, and an inner barrier segment 30C overlapping the gap 30B. The barrier 30 surrounding the second bonding site 24D (a portion of which is shown in more detail in FIG. 12) includes a pair of inner and outer discontinuous rings 30, each made up of segments 30A that form gaps 30B therebetween. Gaps 30B in the outer ring 30 are overlapped by segments 30A of the inner ring 30, and vice versa. This configuration containing double discontinuous rings 30 with overlapping gaps 30B is preferred for the electrode 44 so that the entire electrode 44 and its bonding site 24D remain both mechanically and electrically connected as one piece. In order to maintain the strength of the device (MEMS) wafer 12, the depths of the grooves that define the reservoirs 28 and barriers 30 are preferably much less than the etch depth required to delineate the fingers 40 and 42. In a preferred embodiment, the reservoirs 28 and barriers 30 can be etched at the same time as the fingers 40 and 42 by utilizing a RIE (reactive ion etching) lag from a DRIE (deep reactive ion etching) etch to achieve different etch depths.

In view of the above, the invention provides the ability to perform eutectic bonding techniques with better process yields by using reflow reservoirs 28 and barriers 30 of various shapes and sizes within and/or surrounding bonding sites 24, so as to directly contact and/or surround bonding stacks 32 that mate with the bonding sites 24 and subsequently form the bonding structures 36 at the completion of the eutectic bonding technique. The ability of the reservoirs 28 and barriers 30 to accommodate and restrict the flow of reflowed bonding alloy is particularly advantageous because it allows excess bonding material to be deposited on a wafer with a significant amount of curvature (for example, the device wafer 12 in FIG. 1A) in order to ensure that sufficient metal is deposited where gaps are likely to be the largest between a pair of wafers (for example, the gap 20 in the central region of the interface 22 between the wafers 12 and 14 in FIG. 1A), while reducing or preventing the excess bonding material at other locations from shorting electrodes and other conductive structures in the vicinity of the bonding material during reflow, such as at the peripheral region of the interface 22 where the gap 20 is smaller (as evident from FIG. 1A) and bonding forces are greater (as represented in FIG. 1B).

Figure 2A:
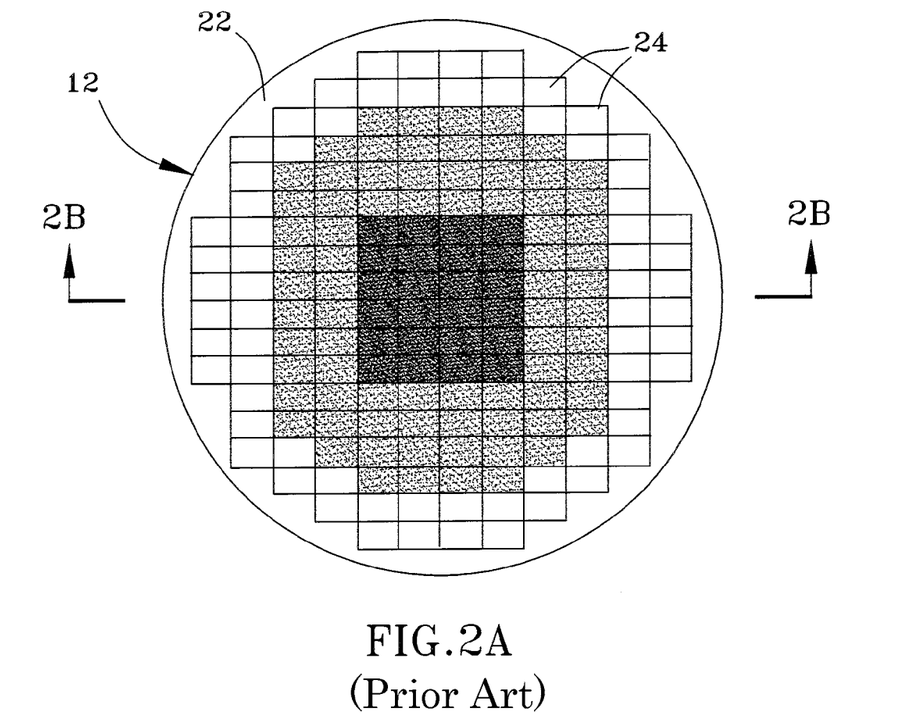
FIG. 2A schematically maps areas on one of the wafers of FIG. 1A at which bonding stacks of different lateral surface areas may be formed to compensate for the surface curvature between the wafers of FIG. 1A.
Figure 2B:
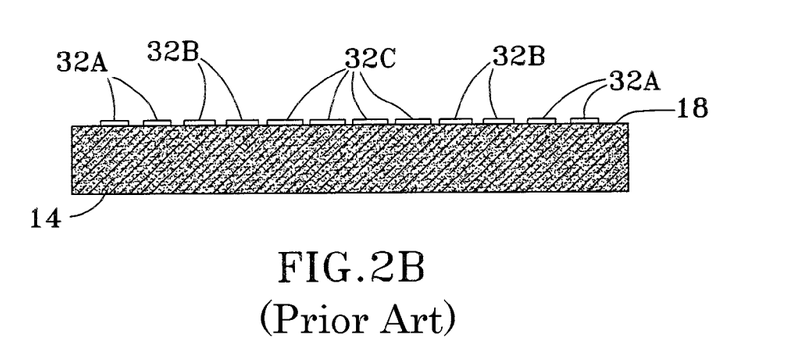
FIG. 2B schematically depicts bonding stacks formed on the wafer of FIG. 2A to have different surface areas to compensate for the surface curvature between the wafers of FIG. 1A.

As an optional but preferred aspect of the invention, the different amounts of bonding alloy required for the central and peripheral regions of the interface 22 in FIGS. 1A and 1B may be addressed by forming the bonding stacks 32 to have different lateral surface areas, depending on their location within the wafer interface 22. As an illustration, three different sizes of bonding stacks 32A, 32B and 32C are schematically represented as having been formed on the surface 16 of the device wafer 12 in FIG. 2B, corresponding to the light, dark and intermediate shaded bonding sites 24 on the surface 16 of the device wafer 12 shown in FIG. 2A. According to the wafer curvature represented in FIG. 1A, FIG. 2B schematically represents smaller bonding stacks 32A deposited within the light-shaded peripheral region of the wafer 12, larger bonding stacks 32C deposited within the darker-shaded central region of the wafer 12, and bonding stacks 32B of intermediate surface areas deposited within the intermediate-shaded annular-shaped region between the central and peripheral regions of the wafer 12. By using a distribution of bonding stacks 32 of different surface areas, more uniform bonding can be achieved between the pair of wafers 12 and 14 as a result of larger bonding stacks 32 providing a greater amount of bonding material, and therefore capable of bridging larger gaps between the wafers 12 and 14 and promoting the formation of reliable bonds across the entire wafer interface 22.

While the invention has been described in terms of particular embodiments, it is apparent that other forms could be adopted by one skilled in the art. For example, the physical configurations of the reflow reservoirs 28 and barriers 30 could differ from those shown, as well as the physical configuration of the wafers 12 and 14, bonding stacks 32, and other features shown in the drawings. In addition, materials and processes other than those noted could be used. Therefore, the scope of the invention is to be limited only by the following claims.

The invention claimed is:

1. A wafer bonding process comprising:
   providing a first bonding site on a surface of a first wafer;
   depositing at least a first bonding stack on a surface of a second wafer;
   forming at least a first groove in the surface of the first wafer, the first groove either surrounding the first bonding site or lying entirely within the first bonding site;
   aligning and mating the first and second wafers so that the first bonding stack on the second wafer contacts the first bonding site on the first wafer, wherein if the first groove lies entirely within the first bonding site then the first bonding stack bridges the first groove after the first and second wafers are aligned and mated; and then
   heating the first and second wafers to reflow the first bonding stack on the second wafer, form a molten bonding material, cause at least a portion of the molten bonding material to flow into the first groove in the surface of the first wafer, and form a first bonding structure that bonds to the first bonding site of the first wafer and bonds the second wafer to the first wafer.

2. The process according to claim 1, wherein the first groove lies entirely within the first bonding site, the first bonding stack bridges the first groove after the first and second wafers are aligned and mated, and the first groove draws the molten bonding material therein by capillary flow during the heating step and is bridged by the first bonding structure following the heating step.

3. The process according to claim 1, wherein the first wafer is a silicon-on-oxide wafer.

4. The process according to claim 1, wherein the first groove surrounds and does not lie within the first bonding site, does not contact the first bonding stack after the first and second wafers are aligned and mated, and is a barrier to overflow of the molten bonding material away from the first bonding site during the heating step.

5. The process according to claim 1, wherein the first bonding stack contains gold and the first bonding structure contains a gold-silicon eutectic alloy.

6. The process according to claim 1, wherein at least one of the surfaces of the first and second wafers has a radius of curvature of less than one hundred meters, and the first and second wafers define an interface therebetween and a gap between the surfaces of the first and second wafers that has a width that is greater at a first location of the interface than at a second location of the interface.

7. The process according to claim 6, further comprising depositing at least a second bonding stack on the surface of the second wafer, wherein the first bonding stack is located at the first location of the interface, the second bonding stack is located at the second location of the interface, and the first bonding stack has a larger surface area than the second bonding stack.

8. The process according to claim 7, further comprising depositing at least a third bonding stack on the surface of the second wafer, wherein the third bonding stack is located at a third location of the interface at which the gap between the surfaces of the first and second wafers has a width that is between the width of the gap at the first and second locations, and the third bonding stack has a surface area that is between the surface areas of the first and second bonding stacks.

9. The process according to claim 7, further comprising applying a bonding pressure to the first and second wafers to cause the portion of the molten bonding material to flow into the first groove during the heating step.

10. The process according to claim 1, further comprising fabricating a microelectromechanical system device on the first wafer prior to the aligning and mating step.

11. The process according to claim 10, further comprising fabricating a CMOS integrated circuit on the second wafer prior to the aligning and mating step, and the first groove prevents the molten bonding material from contacting an electrode of the CMOS integrated circuit.

12. The process according to claim 10, wherein the first bonding site is adjacent the microelectromechanical system device and the first groove prevents the molten bonding material from contacting the microelectromechanical system device.

13. The process according to claim 10, wherein the microelectromechanical system device comprises a proof mass and interdigitated fingers, and the first groove prevents the molten bonding material from contacting the interdigitated fingers of the microelectromechanical system device.

14. The process according to claim 5, wherein the first wafer is formed of silicon and the gold-silicon eutectic alloy forms during the heating step by diffusion of silicon from the first wafer into the first bonding stack.

15. The process according to claim 4, wherein the first groove is a continuous ring that surrounds the first bonding site.

16. The process according to claim 4, further comprising depositing at least a second bonding stack on the surface of the second wafer, the second bonding stack defining a continuous ring that surrounds the first groove in the surface of the first wafer, wherein the aligning and mating step comprises aligning, mating and contacting the second bonding stack on the second wafer with a second bonding site on the first wafer, and the heating step comprises reflowing the second bonding stack on the second wafer, forming a second molten bonding material, and causing at least a portion of the second molten bonding material to flow into the first groove in the surface of the first wafer.

17. The process according to claim 4, further comprising forming a second groove that lies entirely within the first bonding site, contacts the first bonding stack after the first and second wafers are aligned and mated, and draws the molten bonding material therein by capillary flow during the heating step.

18. The process according to claim 4, wherein the first groove is a segment of a first discontinuous ring that surrounds the first bonding site.

19. The process according to claim 18, further comprising forming a second discontinuous ring that surrounds the first bonding site and surrounds the first discontinuous ring.

20. The process according to claim 19, wherein at least one of the first and second discontinuous rings defines a gap that is overlapped by the other of the first and second discontinuous rings.

21. A wafer bonding process comprising:
providing first and second bonding sites on a surface of a first wafer;
depositing at least first and second bonding stacks on a surface of a second wafer, the first bonding stack having a larger surface area than the second bonding stack;
aligning and mating the first and second wafers so that the first and second bonding stacks on the second wafer contact the first and second bonding sites on the first wafer, respectively, the first and second wafers defining an interface therebetween and a gap between the surfaces of the first and second wafers, the gap having a width that is greater at a first location of the interface at which the first bonding stack and the first bonding site are located than at a second location of the interface at which the second bonding stack and the second bonding site are located; and then
heating the first and second wafers to reflow the first and second bonding stacks on the second wafer, form a molten bonding material, and form first and second bonding structures that bond to the first and second bonding sites of the first wafer and bond the second wafer to the first wafer.

22. The process according to claim 21, wherein at least one of the surfaces of the first and second wafers has a radius of curvature of less than one hundred meters.

23. The process according to claim 21, further comprising depositing at least a third bonding stack on the surface of the second wafer, wherein the third bonding stack is located at a third location of the interface at which the gap between the surfaces of the first and second wafers has a width that is between the width of the gap at the first and second locations, and the third bonding stack has a surface area that is between the surface areas of the first and second bonding stacks.

24. The process according to claim 21, further comprising forming at least a first groove in the surface of the first wafer, the first groove either surrounding the first bonding site or lying entirely within the first bonding site, wherein during the heating step at least a portion of the molten bonding material flows into the first groove in the surface of the first wafer.

* * * * *